United States Patent
Ganev et al.

(10) Patent No.: US 7,791,887 B2
(45) Date of Patent: Sep. 7, 2010

(54) CONTOUR SURFACE COOLING OF ELECTRONICS DEVICES

(75) Inventors: Evgeni Ganev, Torrance, CA (US);
Robert Dietrich, Montebello, CA (US);
Michael Quan, Torrance, CA (US)

(73) Assignee: Honeywell International Inc.,
Morristown, NJ (US)

( * ) Notice: Subject to any disclaimer, the term of this patent is extended or adjusted under 35 U.S.C. 154(b) by 240 days.

(21) Appl. No.: 12/029,749

(22) Filed: Feb. 12, 2008

(65) Prior Publication Data

US 2009/0201648 A1  Aug. 13, 2009

(51) Int. Cl.
*H05K 7/20* (2006.01)
*H01G 2/08* (2006.01)

(52) U.S. Cl. .................. 361/707; 361/704; 361/274.3

(58) Field of Classification Search ............... None
See application file for complete search history.

(56) References Cited

U.S. PATENT DOCUMENTS

| | | | |
|---|---|---|---|
| 4,137,723 A | 2/1979 | Tyree | |
| 5,016,139 A | 5/1991 | Stopa et al. | |
| 5,210,513 A * | 5/1993 | Khan et al. | 336/61 |
| 5,373,418 A * | 12/1994 | Hayasi | 361/707 |
| 6,185,811 B1 * | 2/2001 | Perry | 29/606 |
| 6,265,840 B1 | 7/2001 | Wiezorek et al. | |
| 6,459,586 B1 * | 10/2002 | Miller et al. | 361/719 |
| 6,552,912 B1 | 4/2003 | Kanazawa et al. | |
| 6,639,798 B1 * | 10/2003 | Jeter et al. | 361/699 |
| 6,757,180 B1 * | 6/2004 | Chiang et al. | 361/807 |
| 7,040,389 B2 * | 5/2006 | Hsu | 165/185 |
| 7,069,649 B2 * | 7/2006 | Tsunezaki et al. | 29/832 |
| 7,130,197 B2 * | 10/2006 | Chin | 361/719 |
| 7,164,584 B2 * | 1/2007 | Walz | 361/704 |
| 7,157,793 B2 | 2/2007 | Torkington et al. | |
| 7,498,917 B1 * | 3/2009 | Yang | 336/90 |
| 2003/0064128 A1 | 4/2003 | Byrnes | |
| 2006/0108100 A1 | 5/2006 | Goldman et al. | |
| 2006/0123828 A1 | 6/2006 | Davies et al. | |
| 2006/0260787 A1 | 11/2006 | Wu et al. | |

FOREIGN PATENT DOCUMENTS

DE    19919098 A1    7/2000

OTHER PUBLICATIONS

European Search Report dated Jun. 3, 2009.

* cited by examiner

*Primary Examiner*—Boris L Chervinsky
(74) *Attorney, Agent, or Firm*—Oral Caglar, Esq.

(57) ABSTRACT

The present invention provides a cooling device including a heat generating device having a device surface with a device surface contour on at least a portion of the device surface and a base having a base surface with a base surface contour on at least a portion of the base surface. The device surface contour and the base surface contour are substantially similar such that at least a portion of the device surface and the base surface fit in close proximity to each other.

13 Claims, 4 Drawing Sheets

CONTOUR SURFACE COOLING OF ELECTRONICS DEVICES

BACKGROUND OF THE INVENTION

The present invention relates to thermal control of power electronics, and more particularly, to the contour surface cooling of housings for power electronics devices.

The aerospace industry has many applications for power electronics devices. This is particularly true in the area of more electric architecture (MEA) for aircraft and military ground vehicles. Important applications for power electronics in the commercial aircraft business include non-bleed air environmental control systems (ECS's), variable-frequency (VF) power distribution systems, and electrical actuation. Current examples include the Boeing 787 and the Airbus Jumbo A380. The next-generation Boeing airplane (replacement of the 737), and the Airbus airplane (replacement of the A320 and A350), will most likely use MEA.

Some military aircraft already utilize MEA, including primary and secondary flight control. Military ground vehicles have migrated toward hybrid electric technology where the main propulsion is electric drives. Therefore substantial demand for electric power utilization has arisen.

Resulting from these tendencies is a significant increase in power conversion needs:

Non-bleed ECS's need additional electric drives for vapor cycle system (VCS) compressors, condenser fans, and liquid pumps.

A large number of electric drives for fans is required. In constant-frequency applications, these fans have predominantly used direct drive (no power electronics) to an induction machine. In the new environment, a double power electronics conversion AC to DC and DC to AC is required.

Auxilliary power unit (APU) and main engine electric start imposes a need for high-power, multiple-use controllers.

Military aircraft require multiple high-voltage (270-Vdc) power conversions.

Future combat systems (FCS) have generally moved toward a high-voltage power distribution system where high-power bidirectional propulsion is being used. The power generation is achieved by a main engine shaft driving a large electric machine(s); again, bidirectional conversion is required for power conditioning and self-starting.

In this environment, there is a need for improved power converters and motor controllers for aircraft and ground military businesses for a number of reasons including, but not limited to:

Increased power-level conversion capabilities to handle increased loads;

Reduced controller weights to be able to accommodate large content increase per platform;

Reduced volume to accommodate electronics housings in limited compartment space;

Increased reliability;

Reduced cost.

The power range for power conversion and motor control units varies from hundreds of watts to hundreds of kilowatts. The efficiency of these converters varies from 80 to 97 percent. Therefore, heat dissipation from 3 to 20 percent of the total power is required. For power conversion levels above several kilowatts, forced cooling is typically needed to achieve acceptable power density levels. The forced cooling is either air or liquid. The proper utilization of the coolant flow is achieved by using special devices called cold plates both for liquids and for air.

Cold plates with a double-sided population of components and brazed fins are very popular in the industry because they provide greater utilization of surfaces. The adhesive or brazing process forms a sandwich-like construction in which fins are permanently attached to two inner planes of the two flat metal side pieces. This structure provides containment for the air or liquid flow. The outer surfaces of the side pieces are available for installing heat-dissipating components. In some cases, the cold plate can be used as a structural carrier for heavy components.

Many high heat-dissipating devices, such as high-power switch modules (HPSM) have a flat surface for interfacing with the heat exchanger. However, some highly dissipating devices such as inductors, transformers and capacitors do not have a flat heat dissipating surface and may have a surface that is rather complex. Consequently, devices without a flat dissipating surface present special challenges in providing heat transfer to a heat exchanger. For example, devices with complex dissipating surfaces may require additional interface components and complex mounting provision to transfer heat to the heat exchanger. Also, a large number of parts, machining, and manual operations may be required. In such designs, material utilization may not be optimal. In some cases there is only line contact between component and base with large gaps for most of the external surface. The result is a heavy and expensive design with poor heat transfer effect.

As can be seen, there is a need for improved ways to cool power-dissipating power electronics components that have a non-flat, heat-dissipating external surface. There is also a need for an improved method and process to install power devices with improved thermal transfer leading to better performance and reduced cost.

SUMMARY OF THE INVENTION

In one aspect of the present invention, a cooling device comprises: a heat generating device having a device surface with a non-flat device surface contour on at least a portion of the device surface; and a base having a base surface with a non-flat base surface contour on at least a portion of the base surface, wherein the non-flat device surface contour and the non-flat base surface contour are substantially similar such that at least a portion of the device surface and the base surface fit together in a nested relationship.

In another aspect of the present invention, a power dissipating electronic assembly comprises: a power dissipating electronic device having a device surface with a non-flat device surface contour on at least a portion of the device surface; and a base having a base surface with a non-flat base surface contour on at least a portion of the base surface, wherein the non-flat device surface contour and the non-flat base surface contour are substantially similar such that at least a portion of the device surface and the base surface fit together in a nested relationship.

In accordance with a further aspect of the present invention, a method of fabricating an electronic assembly comprises: shaping a non-flat contoured surface of a base unit to conform to a non-flat contoured surface of a power dissipating electronic component; assembling the base unit to the power dissipating electronic component such that the non-flat contoured surface of the base unit is adjacent to the non-flat contoured surface of the power dissipating electronic component; and securing the power dissipating electronic component to the base unit.

These and other features, aspects and advantages of the present invention will become better understood with reference to the following drawings, description and claims.

DETAILED DESCRIPTION OF THE INVENTION

Figure 1:
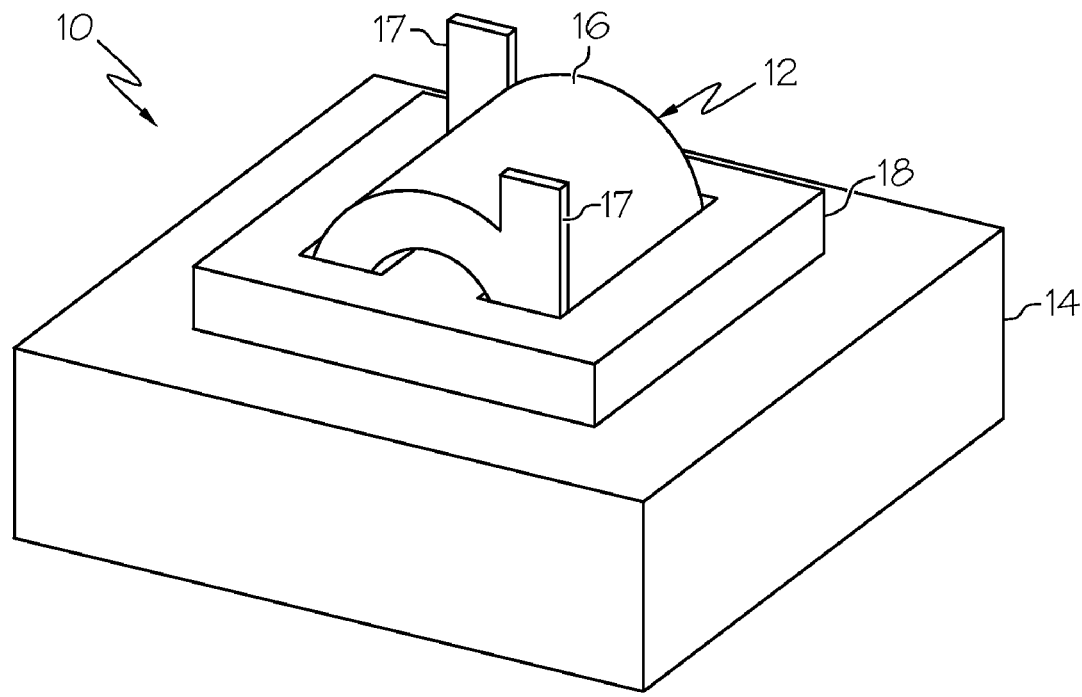
FIG. 1 is a perspective view of an inductor assembly with contour surface cooling in accordance with one embodiment of the invention.

The following detailed description is of the best currently contemplated modes of carrying out the invention. The description is not to be taken in a limiting sense, but is made merely for the purpose of illustrating the general principles of the invention, since the scope of the invention is best defined by the appended claims.

Broadly, the present invention provides for cooling of non-flat, heat-rejecting external surfaces of a heat dissipating component. Embodiments of the present invention may use a thermal filler between a component and a base plate. The base plate in accordance with embodiments of the invention may be shaped in such a way to match the non-flat surface of the component. Embodiments of the present invention may be advantageously used in many different power electronics applications, including MEA aerospace applications. These applications may include passive and force-cooled housings for power electronics converters and motor controllers.

Prior art electric convection cooling approaches may only have provided limited line contact between the component and the base. The result of such limited contact may have been large gaps between most of the external surface of the component and the base, which provides very limited conduction of heat from the component and the base. In contrast, embodiments of the present invention may have much greater area of contact between the external surface of the component and the base, resulting in significantly more conduction of heat from the component to the base. Some prior art systems utilize cold plate heat exchangers to increase the amount of heat conducted away from the component. However, cold plate heat exchangers may have been costly because they required a large number of parts requiring machining and manual operations. The present invention may be produced for lower cost than cold plate heat exchangers because it requires fewer components. In addition, the invention may provide improved structural integrity of the housing and the electronic power devices because the device is enveloped in the structure. There may be reduced weight due to optimized structural integrity and the elimination of multiple mounting parts. The elimination of multiple parts may also result in reduced volume and reduced labor time. Cost may also be reduced due to reduced number of labor operations and assembly time, reduced number of machining operations, and reduced number and variety of materials required.

Also, with the present invention, the use of contaminating materials may be reduced because the use of glue may be avoided. Improved reliability may be achieved due to the reduced number of parts, optimized structural integrity and reduced component temperature. Improved EMI performance for radiation emissions and susceptibility to radiation may result due to a better enclosure of the devices. Improved grounding resistance may result due to a reduced number of mechanical joints and not using glue. Improved yield may be achieved due to increased machining-to-manual labor ratio and lower probability of human error; improved repairability because the device can be easily detached for replacement and the thermal compound removed.

FIG. 1 shows a perspective view of an inductor assembly 10 that may include an inductor 12 having an irregularly shaped mounting surface installed on a base plate 14. While an inductor 12 is used to illustrate the principals of the invention, other assemblies having heat-generating components may be utilized with the invention, including transformers, capacitors and other components. The base plate 14 may be composed of a material, such as metal, having relatively high thermal conductivity to facilitate the conduction of heat away from the inductor 12. The base plate 14 may have a non-flat contour surface that conforms to the shape of the inductor 12, as described in more detail below. The base plate 14 may provide both cooling and structural support for the inductor 12. The inductor 12, in this embodiment, may be an edge-wound inductor that includes copper winding 16 having terminals 17 and a core 18. When operating, the inductor 12 may dissipate power in both the copper windings 16 and the core 18.

Figure 2:
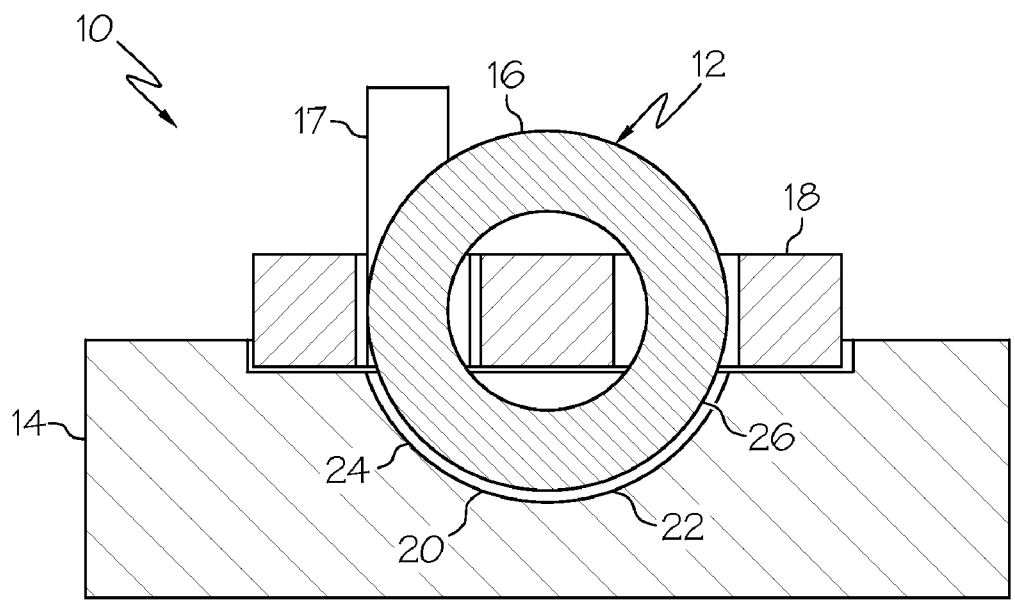
FIG. 2 is a cross-sectional view of the inductor assembly shown in FIG. 1.

FIG. 2 shows a cross-section of the inductor assembly 10. The present invention may employ a non-flat contour surface method in which the base plate 14 has been cut away to create a non-flat contoured base plate surface 24 which matches a non-flat contoured copper winding surface 26. A gap 20 may exist between the contoured copper winding surface 26 and the contoured base plate surface 24. A high-thermal-conductivity compound 22 may fill the gap 20. In this embodiment, both the copper winding 16 and the core 18 may be in close contact with the base plate 14 so that heat can be readily dissipated through the gap 20 filled with the high-thermal-conductivity compound 22.

The degree of contouring, for example by machining, of the base plate 14 may vary from a rough fit to a very exact fit depending on the cooling required for the application. For example, the non-flat contoured base plate surface 24 may match the non-flat contoured copper winding surface 26 such that when in nested relation as shown in FIG. 2, the gap 20 between the two surfaces should not exceed about 0.030 inches.

In some applications it may be desirable to provide additional electrical isolation between the heat generating electrical component and the base. In such cases, additional dielectric protection of the heat-generating component may be achieved by the invention by various techniques, including, but not limited to the following:

anodizing the contoured base plate surface 24 near the inductor 12;

application of an insulator painted on the base plate 14 and on the inductor 12;

insertion of a thin sheet or film of insulation between the base plate 14 and the inductor 12; and adjusting the contouring to mechanically maintain a small minimum separation between the inductor 12 and the base plate 14 and relying on the dielectric properties of the thermal compound for isolation.

Figure 3:
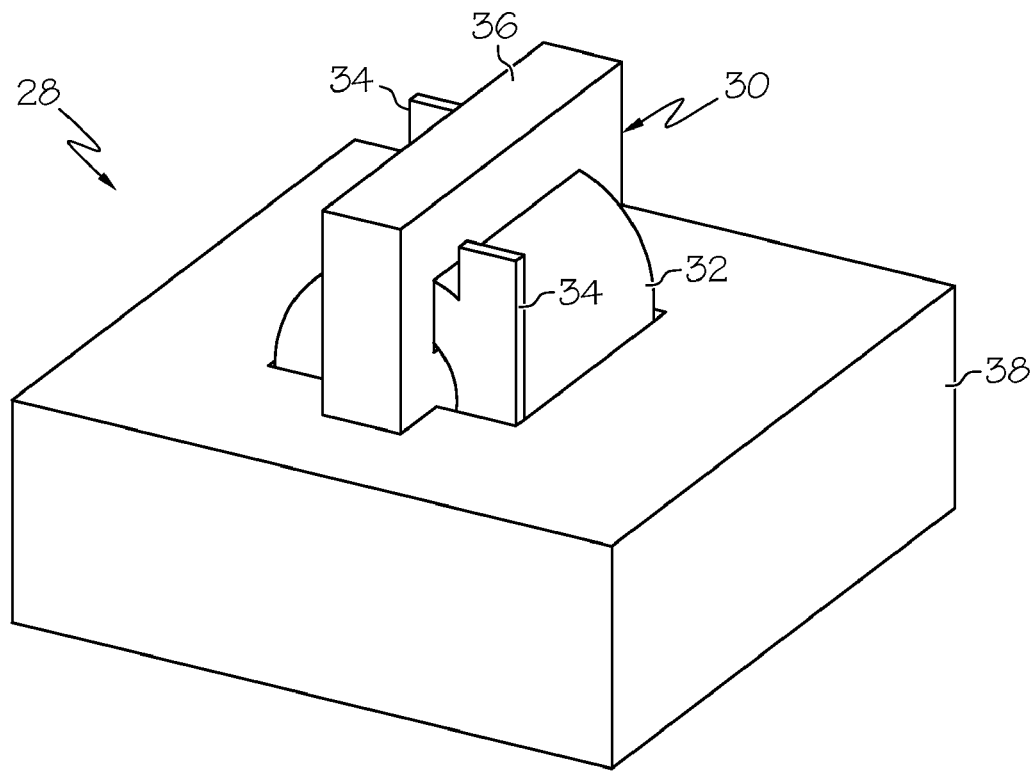
FIG. 3 is a perspective view of an inductor assembly with contour surface cooling in accordance with another embodiment of the invention.
Figure 4:
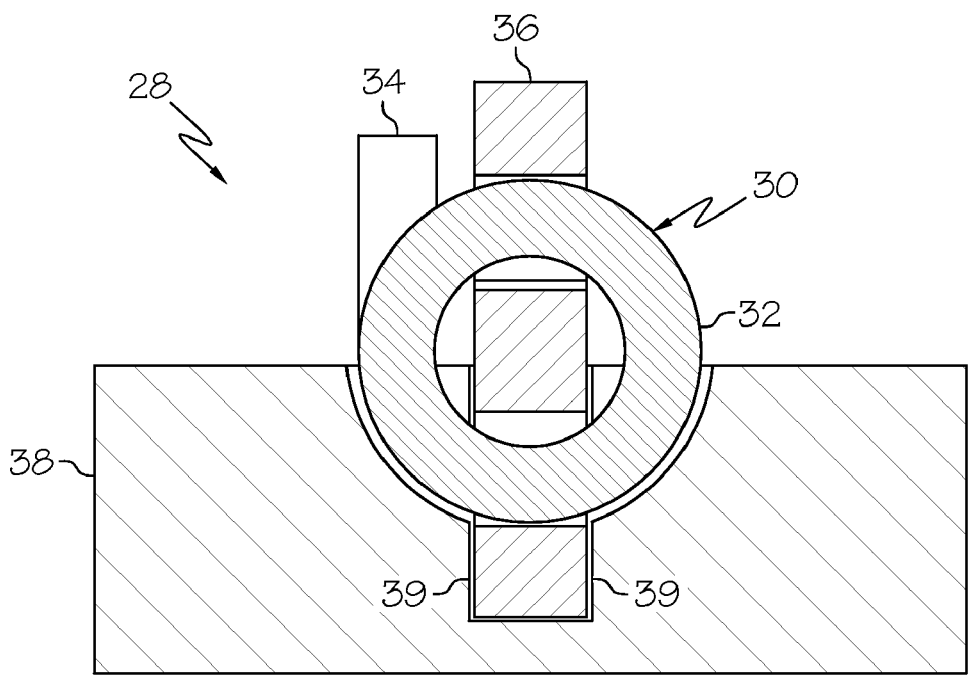
FIG. 4 is a cross-sectional view of the inductor assembly shown in FIG. 3.

FIG. 3 is a perspective view of an inductor assembly 28 with contour surface cooling in accordance with another embodiment of the invention. FIG. 4 is a cross-sectional view of the inductor assembly 28 shown in FIG. 3. The inductor assembly 28 may include an inductor 30 having a copper winding 32, terminals 34, a core 36 and a base plate 38. In this embodiment, the core 36 may be rotated 90 degrees as compared to the core 18 shown in FIGS. 1 and 2. Also in this embodiment, the windings may remain closely surrounded by the contoured base plate 38, for example, as described below, such that the gap between the two is less than about 0.030 inches.

In some applications, this configuration may be preferred over the inductor assembly 10 shown in FIGS. 1 and 2. This is because in FIGS. 1 and 2, the thermal conductivity of the core 18 was isotropic, such that stacked iron laminations may have low thermal conductivity perpendicular to the stacked layers. Thus heat flow from the core 18 to the base plate 14 may be reduced. In contrast, in inductor assembly 28 shown in FIGS. 3 and 4, the core 36 may be rotated 90 degrees, compared to FIGS. 1 and 2. In this case, the stacked iron laminations may have higher thermal conductivity parallel to the stacked layers, thereby increasing the flow of heat to the base plate 38. In particular, heat may flow more readily in the plane of the laminations of the core 36 than perpendicular to this plane. This may be because the insulating material typically placed between the laminations may block the conduction of heat from lamination-to-lamination. In FIG. 3, the planes of the surfaces of the laminations are parallel to the surfaces 39 shown in FIG. 3. As a result, base 38 is positioned to conduct more heat from the core 36, than base 14 is positioned to conduct from core 18 in FIG. 1. In various embodiments, the configuration of inductor assembly 10, or that of inductor assembly 28, could be used, depending upon any directional characteristics of the component to take advantage of the best direction for heat conduction.

Figure 5:
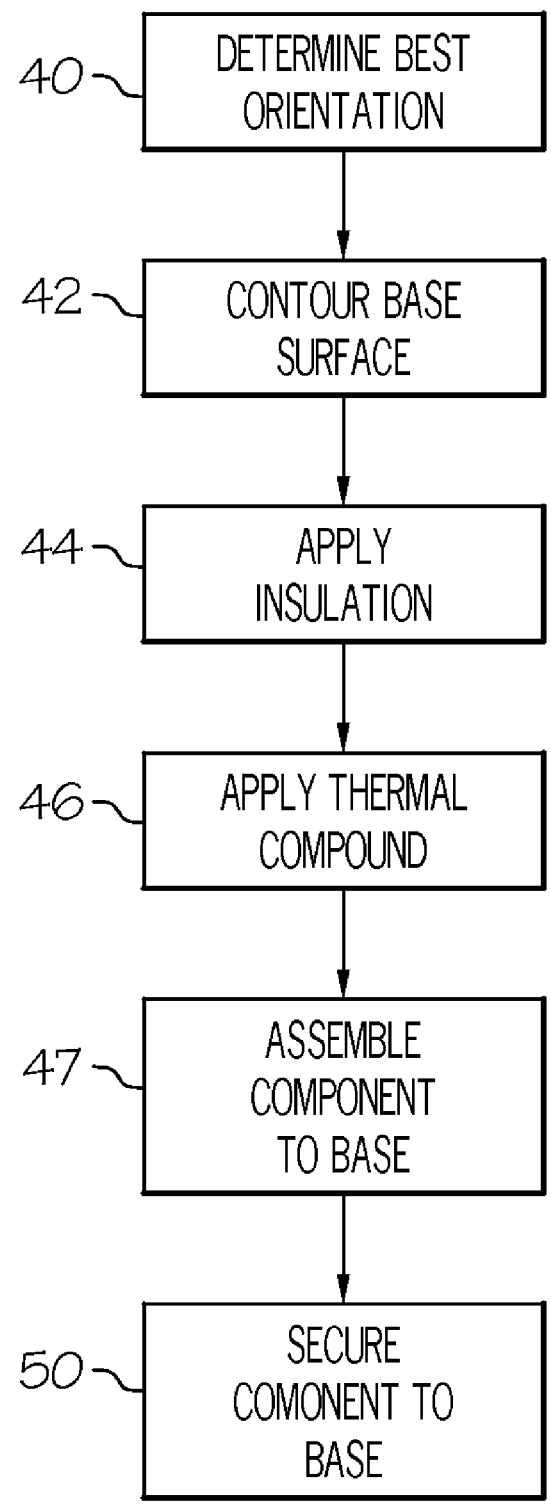
FIG. 5 is a flow diagram of a process for fabricating a heat-dissipating device having non-flat contour surface cooling in accordance with an embodiment of the invention.

In another embodiment of the invention, the inductor assembly 10 or 28 may be fabricated according to the process shown in FIG. 5. In step 40 the process may determine the best orientation for the component with respect to the mounting surface, such as base plate surface 24, with consideration of any preferred orientations. In step 42 the base plate surface 24 may be machined or cast to match the contour of the component mounting surface, such as winding surface 26. Electrical insulation material may be applied to the mounting interface as needed in step 44.

In step 46 a sufficient amount of thermal compound 22 may be applied between the contoured surfaces 24 and 26 to insure that all voids will be filled. Various thermal compounds may be used such as, for example Abletherm 12-1, (Emerson & Cuming), T-putty 502 (Laird Industries), Any excessive compound may be allowed to squeeze out of the interface and be removed. In step 48 the component, such as inductor 12, may be assembled onto the base, such as base 14, with the matching contoured surfaces 24 and 26 and pressed together. The component may then be secured to the contoured base plate with appropriate fasteners, such as screws or bolts, to maintain adequate interface pressure and alignment.

Figure 6:
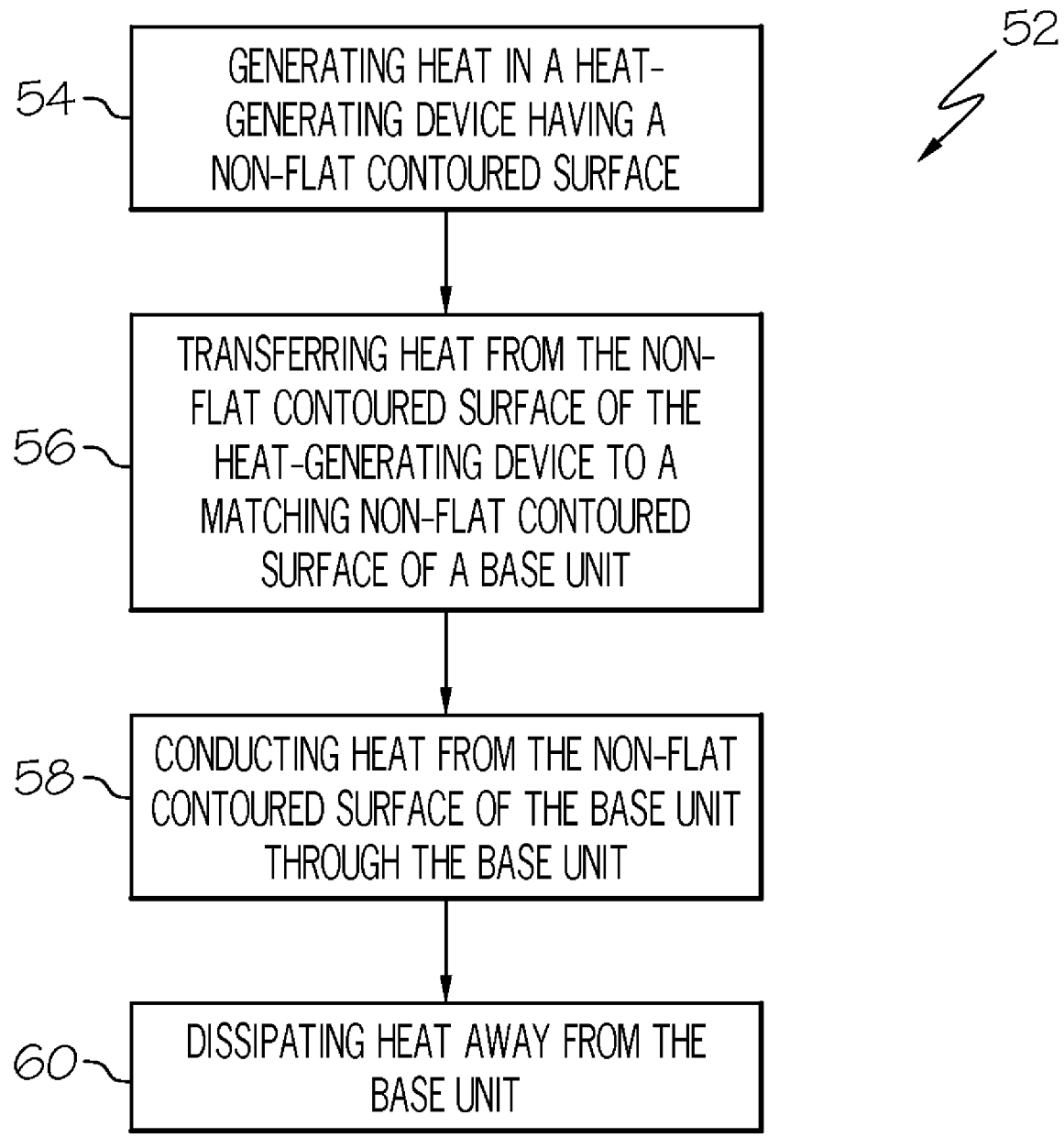
FIG. 6 is a flow chart of a method for cooling a heat-dissipating device.

FIG. 6 shows a flow chart of a method 52 for extracting heat from a heat-generating device, such as inductor 12. In step 54, a heat-generating device having a non-flat contoured surface generates heat. In step 56, heat is transferred from the non-flat contoured surface of the heat-generating device to a matching non-flat contoured surface of a base unit. The base unit may comprise, for example, base unit 14. In step 58 heat is conducted away from the non-flat contoured surface of the base unit through the base unit. Heat is then dissipated away from the base unit, in step 60.

It should be understood, of course, that the foregoing relates to exemplary embodiments of the invention and that modifications may be made without departing from the spirit and scope of the invention as set forth in the following claims.

We claim:

1. A cooling device comprising:
 a heat generating device including a core and a coil, the heat generating device having a device surface with a non-flat device surface contour on at least a portion of said device surface,
 the non-flat device surface contour including at least a portion of the core and at least a portion of the coil, and the non-flat device surface contour including a curved portion and a flat portion; and
 a base having a base surface with a non-flat base surface contour on at least a portion of said base surface, wherein said non-flat device surface contour and said non-flat base surface contour are similar such that portions of said device surface including the curved portion and the flat portion and said base surface fit together in a nested relationship.

2. The cooling device of claim 1 further comprising a thermal conducting compound disposed between said non-flat device surface contour and said non-flat base surface contour.

3. The cooling device of claim 1 further comprising a sheet of insulating material disposed between said non-flat device surface contour and said non-flat base surface contour.

4. The cooling device of claim 1 wherein said non-flat base surface contour is anodized.

5. The cooling device of claim 1 further comprising an air gap between said device surface and said base surface.

6. The cooling device of claim 1 wherein said heat generating device is an electronic device.

7. The cooling device of claim 1 wherein said non-flat base surface contour is a machined surface contour.

8. The cooling device of claim 1 wherein said base is a cast material and said non-flat base surface contour is cast into said base outer surface.

9. The cooling device of claim 1 wherein said base is comprised of metal.

10. A power dissipating electronic assembly comprising:
 a power dissipating electronic device having a coil, a core, and a device surface,
 the core comprising of a plurality of lamination sheets with insulating material situated between surfaces of one or more of the plurality of lamination sheets, and
 the device surface having a non-flat device surface contour on at least a portion of said device, wherein at least a portion of the non-flat device surface contour comprises at least a portion of the core and at least a portion of the coil;
 a base having an base surface with a non-flat base surface contour on at least a portion of said base surface, wherein said non-flat device surface contour and said non-flat base surface contour conform to each other in shape such that at least a portion of said device surface and said base surface fit together in a nested relationship; and
 a thermal conducting compound disposed between and contacting said non-flat device surface contour and said non-flat base surface contour;

wherein the core is disposed such that a general direction of flow of heat from the device to the base is parallel to the surfaces of the one or more of the plurality of lamination sheets.

11. The power dissipating electronic assembly of claim 10 wherein said power dissipating electronic device is an inductor.

12. The power dissipating electronic assembly of claim 10 wherein said power dissipating electronic device is a transformer.

13. The power dissipating electronic assembly of claim 10 wherein said power dissipating electronic device is a capacitor.

* * * * *